United States Patent
Gauvin et al.

(10) Patent No.: US 9,021,325 B2
(45) Date of Patent: Apr. 28, 2015

(54) CLASSIFYING BIT ERRORS IN TRANSMITTED RUN LENGTH LIMITED DATA

(71) Applicant: LSI Corporation, San Jose, CA (US)

(72) Inventors: Coralyn S. Gauvin, Colorado Springs, CO (US); Gabriel L. Romero, Colorado Springs, CO (US)

(73) Assignee: LSI Corporation, San Jose, CA (US)

( * ) Notice: Subject to any disclaimer, the term of this patent is extended or adjusted under 35 U.S.C. 154(b) by 98 days.

(21) Appl. No.: 13/761,427

(22) Filed: Feb. 7, 2013

(65) Prior Publication Data

US 2014/0223270 A1 Aug. 7, 2014

(51) Int. Cl.
*G01R 31/28* (2006.01)
*G06F 11/00* (2006.01)
*G06F 11/08* (2006.01)
*G06F 11/277* (2006.01)
*G01R 31/3193* (2006.01)

(52) U.S. Cl.
CPC .............. *G06F 11/08* (2013.01); *G06F 11/277* (2013.01); *G01R 31/3193* (2013.01)

(58) Field of Classification Search
CPC .......................... G01R 31/3193; G06F 11/277
USPC ................................................... 714/736, 735
See application file for complete search history.

(56) References Cited

U.S. PATENT DOCUMENTS

| | | | | |
|---|---|---|---|---|
| 5,255,130 A * | 10/1993 | Buchan et al. | ................... | 360/41 |
| 5,587,807 A * | 12/1996 | Ootsuka et al. | ............... | 386/264 |
| 5,761,212 A * | 6/1998 | Foland et al. | ................. | 714/719 |
| 5,774,470 A * | 6/1998 | Nishiya et al. | ................ | 714/703 |
| 6,812,868 B2 * | 11/2004 | Yamakawa et al. | ............. | 341/59 |
| 7,158,324 B2 * | 1/2007 | Stein et al. | ....................... | 360/31 |
| 7,370,251 B2 * | 5/2008 | Nadeau-Dostie et al. | ..... | 714/723 |
| 7,447,955 B2 * | 11/2008 | Niijima et al. | ................ | 714/718 |
| 2005/0022091 A1 * | 1/2005 | Holman | ........................ | 714/758 |
| 2005/0232106 A1 * | 10/2005 | Langereis | .................. | 369/47.53 |
| 2007/0136625 A1 * | 6/2007 | Niijima et al. | ................ | 714/718 |

OTHER PUBLICATIONS

LatticeSC/Marvell XAUI Interoperability, Lattice Semiconductor Corporation, Technical Note TN1128, Nov. 2006.

* cited by examiner

*Primary Examiner* — Joseph D Torres
(74) *Attorney, Agent, or Firm* — Duft Bornsen & Fettig

(57) ABSTRACT

A test pattern is encoded using a run length limited line encoding to produce an encoded block of data. The encoded block of data is sent via a channel. A plurality of bits in the received block of data that are subsequent to a maximum length run in the sent data is compared to an expected plurality of bits. A type of bit error is classified based on a mismatch between the expected plurality of bits and the plurality of bits in the received block of data.

20 Claims, 4 Drawing Sheets

```
┌─────────────────────────────────────────────────────────┐
│ ENCODE A TEST PATTERN USING A RUN LENGTH LIMITED        │
│ LINE ENCODING TO PRODUCE A FIRST ENCODED BLOCK OF       │
│ DATA HAVING NO MORE THAN A FIRST MAXIMUM NUMBER OF      │
│ CONSECUTIVE BITS HAVING THE SAME VALUE AND AT LEAST     │
│ A FIRST RUN WITH THE FIRST MAXIMUM NUMBER OF            │
│ CONSECUTIVE BITS HAVING THE SAME VALUE                  │
│                          302                            │
└─────────────────────────────────────────────────────────┘
                              │
┌─────────────────────────────────────────────────────────┐
│ CHANGE AT LEAST ONE BIT IN THE FIRST ENCODED BLOCK      │
│ OF DATA TO PRODUCE A SECOND ENCODED BLOCK OF DATA       │
│ THAT HAS A SECOND MAXIMUM NUMBER OF CONSECUTIVE         │
│ BITS HAVING THE SAME VALUE AND AT LEAST A SECOND        │
│ RUN WITH THE SECOND MAXIMUM NUMBER OF                   │
│ CONSECUTIVE BITS HAVING THE SAME VALUE, THE SECOND      │
│ MAXIMUM GREATER THAN THE FIRST MAXIMUM                  │
│                          304                            │
└─────────────────────────────────────────────────────────┘
                              │
┌─────────────────────────────────────────────────────────┐
│      SEND THE SECOND ENCODED BLOCK OF DATA TO A         │
│                 RECEIVER VIA A CHANNEL                  │
│                          306                            │
└─────────────────────────────────────────────────────────┘
                              │
┌─────────────────────────────────────────────────────────┐
│ USING THE RECEIVER, RECEIVE A RECEIVED BLOCK OF DATA    │
│ THAT CORRESPONDS TO THE SECOND ENCODED BLOCK OF         │
│                          DATA                           │
│                          308                            │
└─────────────────────────────────────────────────────────┘
                              │
┌─────────────────────────────────────────────────────────┐
│ COMPARING A PLURALITY OF BITS IN THE RECEIVED BLOCK     │
│ OF DATA THAT ARE SUBSEQUENT TO THE SECOND RUN TO        │
│           AN EXPECTED PLURALITY OF BITS                 │
│                          310                            │
└─────────────────────────────────────────────────────────┘
                              │
┌─────────────────────────────────────────────────────────┐
│ CLASSIFY A TYPE OF BIT ERROR BASED ON A MISMATCH        │
│ BETWEEN THE EXPECTED PLURALITY OF BITS AND THE          │
│ PLURALITY OF BITS IN THE RECEIVED BLOCK OF DATA         │
│                          312                            │
└─────────────────────────────────────────────────────────┘
```

FIGURE 3

CLASSIFYING BIT ERRORS IN TRANSMITTED RUN LENGTH LIMITED DATA

BACKGROUND

Mass storage systems continue to provide increased storage capacities to satisfy user demands. Photo and movie storage, and photo and movie sharing are examples of applications that fuel the growth in demand for larger and larger storage systems. A solution to these increasing demands is the use of arrays of multiple inexpensive disks. These arrays may be configured in ways that provide redundancy and error recovery without any loss of data. These arrays often are interconnected, and/or connected to a host using Serial Attached SCSI (SAS) communication links.

SAS is a communication protocol used to move data to and from computer storage devices such as hard drives and tape drives. SAS is a point-to-point serial protocol that displaces parallel SCSI bus technology in many computer systems and storage environments. SAS uses the standard SCSI command set. At the physical layer, the SAS standard defines connectors and voltage levels. The physical characteristics of the SAS wiring and signaling are compatible with and have loosely tracked that of serial ATA (SATA). SAS defines more rigorous physical signaling specifications as well as a wider allowable differential voltage swing intended to allow longer cabling. To characterize and/or debug SAS links, industry standard bit patterns (e.g., CJTPAT) may be used to generate and data transmitted via SAS links.

SUMMARY

An embodiment of the invention may therefore comprise a method of classifying bit errors in run length limited data transmitted over a channel, comprising: encoding a test pattern using a run length limited line encoding to produce an encoded block of data, the encoded block of data having no more than a maximum number of consecutive bits having the same value, the encoded block of data having a run of the maximum number of consecutive bits having the same value; sending, to a receiver, the encoded block of data via the channel, the channel coupled to said receiver; receiving, using said receiver, a received block of data corresponding to the sent encoded block of data; comparing a plurality of bits in the received block of data that are subsequent to the run to an expected plurality of bits; and, classifying a type of bit error based on a mismatch between the expected plurality of bits and the plurality of bits in the received block of data.

An embodiment of the invention may therefore further comprise an apparatus for classifying bit errors in run length limited data transmitted over a channel, comprising: an encoder that encodes a test pattern using a run length limited line encoding to produce an encoded block of data, the encoded block of data having no more than a maximum number of consecutive bits having the same value, the encoded block of data having a first run of the maximum number of consecutive bits having the same value; a transmitter that sends, to a receiver, the encoded block of data via the channel, the channel coupled to said receiver, the receiver outputting a received block of data corresponding to the sent encoded block of data; a comparator that compares a plurality of bits in the received block of data that are subsequent to the first run to an expected plurality of bits; and, a classifier that classifies a type of bit error based on a mismatch between the expected plurality of bits and the plurality of bits in the received block of data.

An embodiment of the invention may therefore further comprise a method of classifying bit errors in run length limited data transmitted over a channel, comprising: encoding a test pattern using a run length limited line encoding to produce a first encoded block of data, the first encoded block of data having no more than a first maximum number of consecutive bits having the same value, the first encoded block of data having a first run of the first maximum number of consecutive bits having the same value; changing at least one bit in the first encoded block of data to produce a second encoded block of data, the second encoded block of data having a second maximum number of consecutive bits having the same value, the second maximum number of consecutive bits greater than the first maximum number of bits, the second encoded block of data having a second run of the second maximum number of consecutive number of bits having the same value; sending, to a receiver, the second encoded block of data via the channel, the channel coupled to said receiver; receiving, using said receiver, a received block of data corresponding to the sent second encoded block of data; comparing a plurality of bits in the received block of data that are subsequent to the second run to an expected plurality of bits; and, classifying a type of bit error based on a mismatch between the expected plurality of bits and the plurality of bits in the received block of data.

BRIEF DESCRIPTION OF THE FIGURES

FIG. 3 is a flowchart of a method of classifying bit errors in run length limited data.

DETAILED DESCRIPTION OF THE EMBODIMENTS

Figure 1:
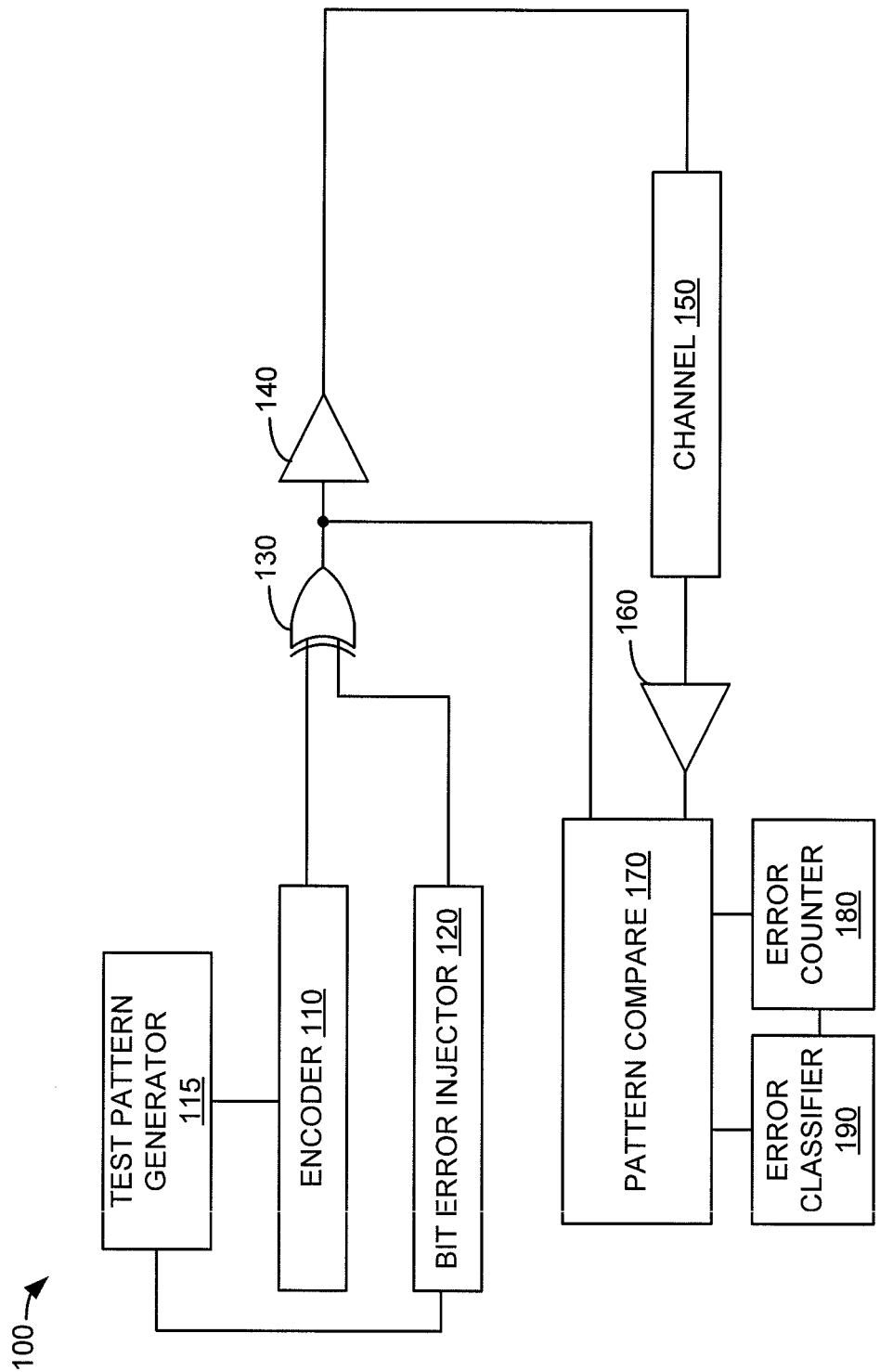
FIG. 1 is a block diagram of system for classifying bit errors.

FIG. 1 is a block diagram of system for classifying bit errors. In FIG. 1, system 100 comprises test pattern generator 115, encoder 110, bit error injector 120, XOR gate 130, transmitter 140, channel 150, receiver 160, pattern compare 170, error counter 180, and error classifier 190. Test pattern generator 115 is operatively coupled to encoder 110. Test pattern generator 115 is operatively coupled to error injector 120. Encoder 110 is operatively coupled to a first input of XOR-gate 130. Bit error injector 120 is operatively coupled to a second input of XOR-gate 130. The output of XOR-gate 130 is operatively coupled to the input of transmitter 140 and a first input of pattern compare 170. The output of transmitter 140 is operatively coupled to a first end of channel 150. The second end of channel 150 is operatively coupled to the input of receiver 160. The output of receiver 160 is operatively coupled to as second input of pattern compare 170. Pattern compare is operatively coupled to error counter 180 and error classifier 190. Error classifier 190 may be operatively coupled to error counter 180.

Test pattern generator 115 can generate test patterns to send to encoder 110. Test pattern generator 115 may generate industry standard test patterns, such as CJPAT, to send to encoder 110. Encoder 110 can encode these test patterns. Encoder 110 can encode these test patterns using a line code. Encoder 110 can encode these test patterns using a run-length limited encoding such as 8b/10b. Encoder 110 provides the encoded test patterns to XOR-gate 130.

Error injector 120 can be configured to generate a specific bit error at a specific location in the transmitted pattern. Error injector 120 may have a register the width of the data bus (e.g., 40 bits) that is used to designate the bit (or bits) which are desired to be "flipped" in the data received from encoder 110 and cause a bit error. At the appropriate time, error injector outputs one or more "1" bits to XOR gate 130. This causes the corresponding bits output by encoder 110 to be inverted by XOR gate 130—thereby injecting at least one error into the bit stream at the output of XOR gate 130. The appropriate time can be specified in another error injector 120 register by an offset into the pattern generated by test pattern generator 115. For instance, the one or more bits may be desired to be inserted on the fifth double word of CJTPAT. Error injector 120 can be configured to inject "at least one bit error" under sequence control. Error injector 120 can be configured to inject the at least one bit error on every loop of the selected pattern.

In an embodiment, error injector 120 can also be responsive to a trigger which would generate an error on the fly. Error injector 120 can also be configured to inject an error at a specific jitter state. Error injector 120 is operatively coupled to test pattern generator 115 so that error injection 120 can receive information about the current test pattern. This information can be used by error injection 120 to inject errors at the appropriate time(s).

The bit pattern output by XOR gate 130 is input to transmitter 140. Transmitter 140 transmits the bit pattern with the one or more errors to receiver 160 via a channel 150. Receiver 160 sends the bit pattern it received (possibly corrupted or changed by imperfections in the channel 150) to pattern compare 170. Pattern compare 170 compares the data received by receiver 160 to the data that was sent by transmitter 140. The differences between the data sent by transmitter 140 and the data received by receiver 160 can be used by error classifier 190 and error counter 180. The differences between the data sent by transmitter 140 and the data received by receiver 160 can be used by error classifier 190 and error counter 180 to help identify intersymbol interference (ISI) and reflection issues.

For example, if a bit flip that was not injected by error injector 120 is caused by ISI, it will most likely occur in the bit transition following the longest run without a transition. For 8b/10b encoding the longest run length is 5. Thus, in a bit pattern of "0101010111111010101" the 13th bit would most likely be flipped by receiver 160 resulting in a received data pattern of "0101010111111110101." If the system has even more ISI then you will start to see this bit flipping occur with a run length of 4 or 3. Error classifier 190 and error counter 180 examine and count these events. Thus, error classifier 190 can determine, for example, that 3 pattern events occurred when the maximum run length of 5 was met, and only 1 when the run length was 4. Thus, in this system you would say we are ISI limited. Error injector 120 can be configured to inject errors that, for example, increase the maximum run length. In other words, for the 8b/10b encoding, error injector 120 can be configured to create a maximum run length of 6 or more bits. This helps allow ISI problems to be classified that would not normally occur because the run length is limited to a maximum number of bits by encoder 110.

If a bit error is caused by reflection, the bit flipping bit flip that was not injected by error injector 120 will not be at the end of a run, but 2 or 3 bits later. For example "0101010111111010101" would become "0101010111111101110" (15th bit flipped) or "0101010111111100010" (14th bit flipped.) Pattern compare can be configured with "don't care" bits on the stream leading up to the long runs and after say 4 for 5 bits following to help restrict the type of error classified by error classifier 190 (and counted by error counter 180). Depending on the location of the flipped bit, it can be determined how far away the discontinuity causing a reflection is from receiver 160.

Figure 2:
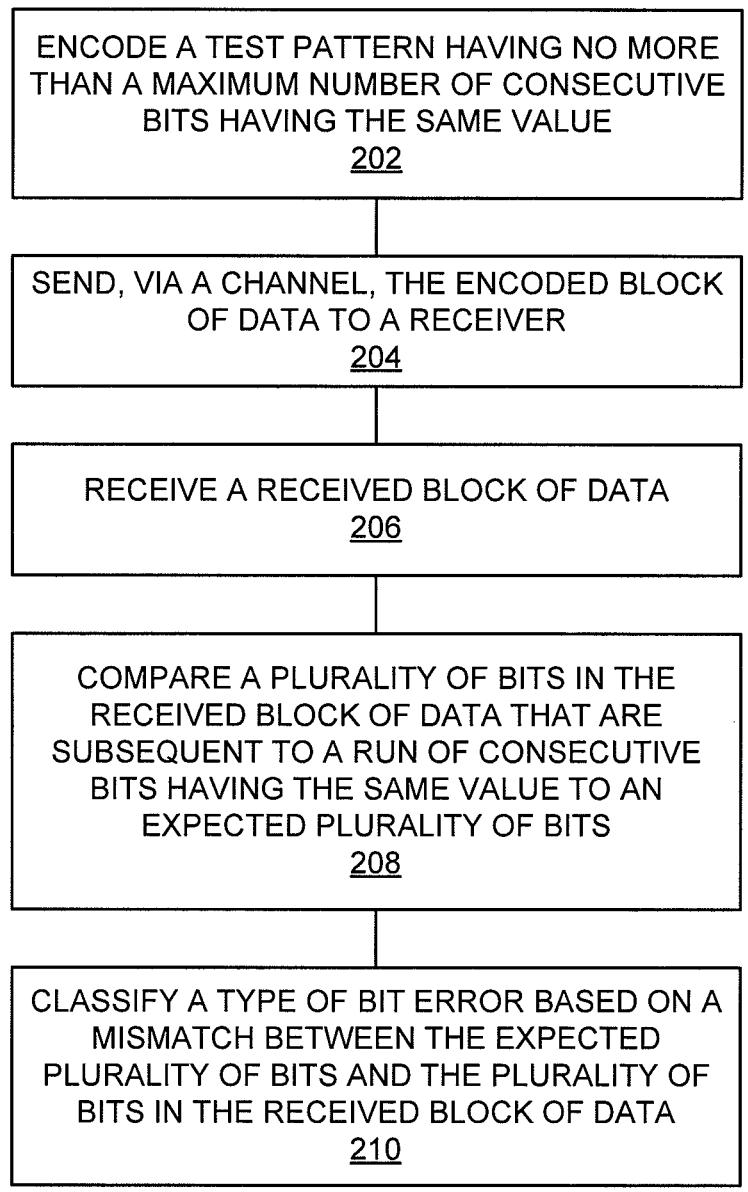
FIG. 2 is a flowchart of a method of classifying bit errors.

FIG. 2 is a flowchart of a method of classifying bit errors. The steps illustrated in FIG. 2 may be performed by one or more elements of system 100. A test pattern is encoded to have no more than a maximum number of consecutive bits having the same value (202). For example, encoder 110 may encode a test pattern received from test pattern generator 115 with a run length limited code. This run length limited code may be, for example, 8b/10b encoding.

Via a channel, the encoded block of data is sent to a receiver (204). For example, a block of data encoded by encoder 110 may be sent unaltered to receiver 160 via channel 150 and transmitter 140. A received block of data is received (206). For example, a received version (possibly with errors) of the data sent by transmitter 140 can be sent by receiver 160 to pattern compare 170.

A plurality of bits in the received block of data that are subsequent to a run of consecutive bits having the same value are compared to an expected plurality of bits (208). For example, pattern compare 170 may compare the 4 or 5 bits following runs of 5 bits in 8b/10b encoded data with an expected pattern. A type of bit error is classified based on a mismatch between the expected plurality of bits and the plurality of bits in the received block of data (210). For example, error classifier 190 may classify an error as being caused by ISI if the mismatch between the expected plurality of bits and the plurality of bits in the received block of data occurred in the first bit following a run of consecutive bits having the same value. In another example, error classifier 190 may classify an error as being caused by a reflection in channel 150 if the mismatch between the expected plurality of bits and the plurality of bits in the received block of data occurred in more than a threshold number of bits (e.g., 4) following a run of consecutive bits having the same value.

FIG. 3 is a flowchart of a method of classifying bit errors in run length limited data. The steps illustrated in FIG. 3 may be performed by one or more elements of system 100. A test pattern is encoded using a run length limited line encoding to produce a first encoded block of data having no more than a first maximum number of consecutive bits having the same value and at least a first run with the first maximum number of consecutive bits having the same value (302). For example, encoder 110 may encode a test pattern received from test pattern generator 115 with a run length limited code. This run length limited code may be, for example, 8b/10b encoding which has a maximum run length (i.e., maximum number of consecutive bits having the same value) of 5 bits.

At least one bit in the first encoded block of data is changed to produce a second encoded block of data that has a second maximum number of consecutive bits having the same value and at least a second run with the second maximum number of consecutive bits having the same value and the second maximum is greater than the first maximum (304). For example, by flipping at least one bit, error injector 120 may cause XOR 130 to output a stream of data with an increased run length than was produced by encoder 110. In other words, if encoder 110 is outputting an 8b/10b encoded stream which has at most 5 consecutive bits having the same value, error injector can cause XOR 130 to output a stream of data with, for example, 6 or 7 consecutive bits having the same value.

The second encoded block of data is sent to a receiver via a channel (306). For example, transmitter 140 may send the second encoded block (which has the increased run length data) to receiver 160 via channel 150. Using the receiver, a received block of data that corresponds to the second encoded block of data is received (308). For example, receiver 160 may receive a possibly corrupted block data after that block of data has passed through channel 150.

A plurality of bits in the received block of data that are subsequent to the second run are compared to an expected plurality of bits (310). For example, pattern compare 170 may compare the 4 or 5 bits following the increased length runs of bits in 8b/10b encoded data with an expected pattern. A type of bit error is classified based on a mismatch between the expected plurality of bits and the plurality of bits in the received block of data (312). For example, error classifier 190 may classify an error as being caused by ISI if the mismatch between the expected plurality of bits and the plurality of bits in the received block of data occurred in the first bit following a run of consecutive bits having the same value. In another example, error classifier 190 may classify an error as being caused by a reflection in channel 150 if the mismatch between the expected plurality of bits and the plurality of bits in the received block of data occurred in more than a threshold number of bits (e.g., 4) following a run of consecutive bits having the same value.

The methods, systems, networks, devices, equipment, and functions described above may be implemented with or executed by one or more computer systems. The methods described above may also be stored on a computer readable medium. Elements of system 100, may be, comprise, include, or be included in, computers systems.

Figure 4:
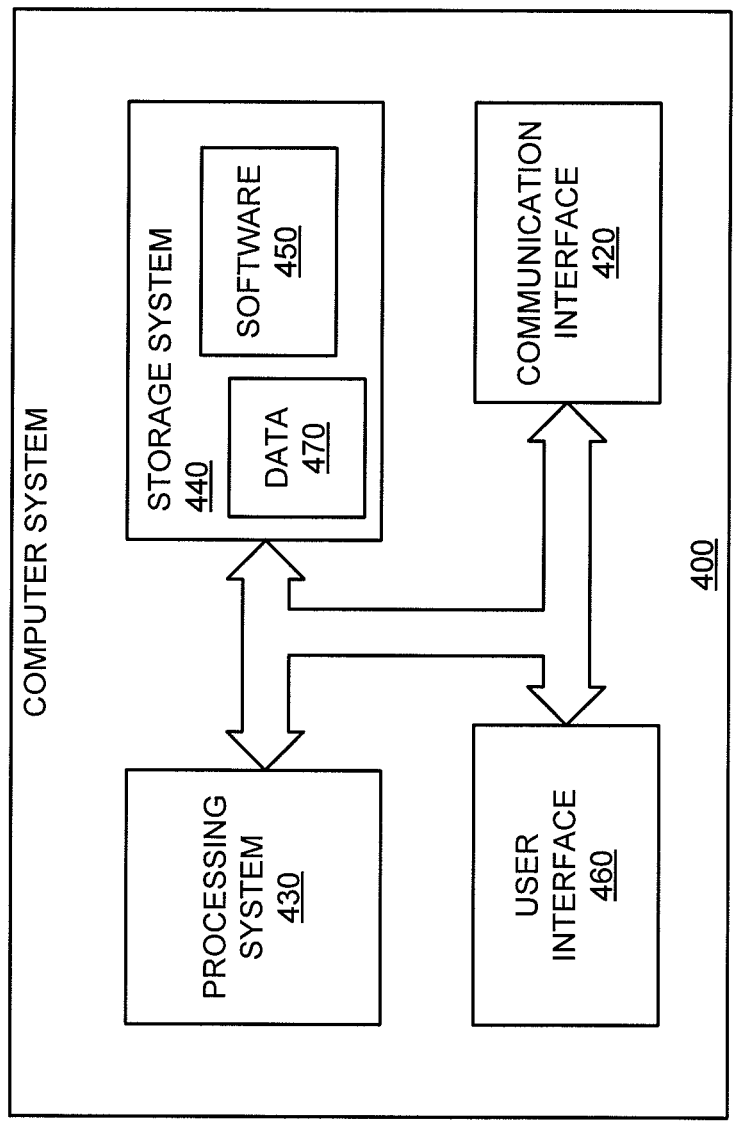
FIG. 4 is a block diagram of a computer system.

FIG. 4 illustrates a block diagram of a computer system. Computer system 400 includes communication interface 420, processing system 430, storage system 440, and user interface 460. Processing system 430 is operatively coupled to storage system 440. Storage system 440 stores software 450 and data 470. Processing system 430 is operatively coupled to communication interface 420 and user interface 460. Computer system 400 may comprise a programmed general-purpose computer. Computer system 400 may include a microprocessor. Computer system 400 may comprise programmable or special purpose circuitry. Computer system 400 may be distributed among multiple devices, processors, storage, and/or interfaces that together comprise elements 420-470.

Communication interface 420 may comprise a network interface, modem, port, bus, link, transceiver, or other communication device. Communication interface 420 may be distributed among multiple communication devices. Processing system 430 may comprise a microprocessor, microcontroller, logic circuit, or other processing device. Processing system 430 may be distributed among multiple processing devices. User interface 460 may comprise a keyboard, mouse, voice recognition interface, microphone and speakers, graphical display, touch screen, or other type of user interface device. User interface 460 may be distributed among multiple interface devices. Storage system 440 may comprise a disk, tape, integrated circuit, RAM, ROM, network storage, server, or other memory function. Storage system 440 may be a computer readable medium. Storage system 440 may be distributed among multiple memory devices.

Processing system 430 retrieves and executes software 450 from storage system 440. Processing system 430 may retrieve and store data 470. Processing system 430 may also retrieve and store data via communication interface 420. Processing system 430 may create or modify software 450 or data 470 to achieve a tangible result. Processing system 430 may control communication interface 420 or user interface 460 to achieve a tangible result. Processing system 430 may retrieve and execute remotely stored software via communication interface 420.

Software 450 and remotely stored software may comprise an operating system, utilities, drivers, networking software, and other software typically executed by a computer system. Software 450 may comprise an application program, applet, firmware, or other form of machine-readable processing instructions typically executed by a computer system. When executed by processing system 430, software 450 or remotely stored software may direct computer system 400 to operate as described herein.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A method of classifying bit errors in run length limited data transmitted over a channel, comprising:
encoding a test pattern using a run length limited line encoding to produce an encoded block of data, the encoded block of data having no more than a maximum number of consecutive bits having the same value, the encoded block of data having a run of the maximum number of consecutive bits having the same value;
sending, to a receiver, the encoded block of data via the channel, the channel coupled to said receiver;
receiving, using said receiver, a received block of data corresponding to the sent encoded block of data;
comparing a plurality of bits in the received block of data that are subsequent to the run to an expected plurality of bits; and,
classifying a type of bit error based on a mismatch between the expected plurality of bits and the plurality of bits that are subsequent to the run in the received block of data.

2. The method of claim 1, wherein the type of bit error is classified based on the position of a mismatched bit between the expected plurality of bits and the plurality of bits in the received block of data.

3. The method of claim 1, wherein the type of bit error is classified as intersymbol interference based or reflection based.

4. The method of claim 1, wherein the type of bit error is classified as a first type of bit error when the mismatched bit occurs immediately subsequent to the run and a second type of bit error when the mismatched bit occurs more than one bit subsequent to the run.

5. The method of claim 4 further comprising:
counting a first total of said first type of bit error; and,
counting a second total of said second type of bit error.

6. The method of claim 1, wherein classifying the type of bit error is based on a relative location of the mismatch with respect to the run.

7. The method of claim 1, wherein:
classifying the type of bit error comprises classifying the type of bit error into one of multiple classes of bit errors that are triggered by runs in RLL encoded data.

8. An apparatus for classifying bit errors in run length limited data transmitted over a channel, comprising:
an encoder that encodes a test pattern using a run length limited line encoding to produce an encoded block of data, the encoded block of data having no more than a maximum number of consecutive bits having the same value, the encoded block of data having a first run of the maximum number of consecutive bits having the same value;

a transmitter that sends, to a receiver, the encoded block of data via the channel, the channel coupled to said receiver, the receiver outputting a received block of data corresponding to the sent encoded block of data;

a comparator that compares a plurality of bits in the received block of data that are subsequent to the first run to an expected plurality of bits; and, a classifier that classifies a type of bit error based on a mismatch between the expected plurality of bits and the plurality of bits that are subsequent to the run in the received block of data.

9. The apparatus of claim 8, wherein the type of bit error is classified based on the position of a mismatched bit between the expected plurality of bits and the plurality of bits in the received block of data.

10. The apparatus of claim 8, wherein the type of bit error is classified as intersymbol interference based or reflection based.

11. The apparatus of claim 8, wherein the type of bit error is classified as a first type of bit error when the mismatched bit occurs immediately subsequent to the run and a second type of bit error when the mismatched bit occurs more than one bit subsequent to the run.

12. The apparatus of claim 8 further comprising:

a first counter that counts a first total of said first type of bit error; and, a second counter that counts a second total of said second type of bit error.

13. The apparatus of claim 8, wherein the classifier classifies the type of bit error based on a relative location of the mismatch with respect to the run.

14. The apparatus of claim 8, wherein:

the classifier classifies the type of bit error into one of multiple classes of bit errors that are triggered by runs in RLL encoded data.

15. An apparatus comprising:

an encoder that generates a Run-Length Limited (RLL) encoded block of data, the RLL encoded block of data having a run of a number of consecutive bits of the same value;

a transmitter that sends the RLL encoded block of data to a receiver, wherein the receiver outputs a received block of data corresponding to the RLL encoded block of data;

a comparator that compares a plurality of bits in the received block of data that are subsequent to the run to an expected plurality of bits; and, a classifier that classifies a type of bit error in the plurality of bits in the received block of data, based on a mismatch between the expected plurality of bits and the plurality of bits that are subsequent to the run in the received block of data.

16. The apparatus of claim 15, wherein the type of bit error is classified based on the position of a mismatched bit between the expected plurality of bits and the plurality of bits in the received block of data.

17. The apparatus of claim 15, wherein the type of bit error is classified as intersymbol interference based or reflection based.

18. The apparatus of claim 15, wherein the type of bit error is classified as a first type of bit error when the mismatched bit occurs immediately subsequent to the run and a second type of bit error when the mismatched bit occurs more than one bit subsequent to the run.

19. The apparatus of claim 15, wherein the classifier classifies the type of bit error based on a relative location of the mismatch with respect to the run.

20. The apparatus of claim 15, wherein:

the classifier classifies the type of bit error into one of multiple classes of bit errors that are triggered by runs in RLL encoded data.

* * * * *